(12) United States Patent
Yeo et al.

(10) Patent No.: US 7,052,964 B2
(45) Date of Patent: May 30, 2006

(54) STRAINED CHANNEL TRANSISTOR AND METHODS OF MANUFACTURE

(75) Inventors: Yee-Chia Yeo, Hsin-Chu (TW); Chih-Hsin Ko, Kaohsiung (TW); Wen-Chin Lee, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/081,919

(22) Filed: Mar. 16, 2005

(65) Prior Publication Data

US 2005/0156274 A1    Jul. 21, 2005

Related U.S. Application Data

(62) Division of application No. 10/423,513, filed on Apr. 25, 2003, now Pat. No. 6,882,025.

(51) Int. Cl.
*H01L 21/336* (2006.01)

(52) U.S. Cl. .................................... 438/296
(58) Field of Classification Search ................ 438/296
See application file for complete search history.

(56) References Cited

U.S. PATENT DOCUMENTS

| | | | |
|---|---|---|---|
| 4,069,094 A | 1/1978 | Shaw et al. |
| 4,314,269 A | 2/1982 | Fujiki |
| 4,497,683 A | 2/1985 | Celler et al. |
| 4,631,803 A | 12/1986 | Hunter et al. |
| 4,892,614 A | 1/1990 | Chapman et al. |
| 4,946,799 A | 8/1990 | Blake et al. |
| 4,952,993 A | 8/1990 | Okumura |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |

(Continued)

FOREIGN PATENT DOCUMENTS

EP   0 683 522 A2   11/1995

(Continued)

OTHER PUBLICATIONS

Ismail, K, et al., "Electron Transport Properties of Si/SiGe Heterostructures: Measurements and Device Implications," Applied Physics Letters, vol. 63, No. 5, (Aug. 2, 1993), pp. 660-662.

(Continued)

*Primary Examiner*—Asok Kumar Sarkar
(74) *Attorney, Agent, or Firm*—Slater & Matsil, L.L.P.

(57) ABSTRACT

A semiconductor device includes a region of semiconductor material with first and second isolation trenches formed therein. The first isolation trench is lined with a first material having a low oxygen diffusion rate and is filled with an insulating material. The second isolation trench is not lined with the first material but is filled with an insulating material. A first transistor is formed adjacent the first isolation region and a second transistor formed adjacent the second isolation region.

46 Claims, 13 Drawing Sheets

U.S. PATENT DOCUMENTS

| | | |
|---|---|---|
| 5,714,777 A | 2/1998 | Ismail et al. |
| 5,763,315 A | 6/1998 | Benedict et al. |
| 5,789,807 A | 8/1998 | Correale, Jr. |
| 5,811,857 A | 9/1998 | Assaderaghi et al. |
| 6,008,095 A | 12/1999 | Gardner et al. |
| 6,015,990 A | 1/2000 | Hieda et al. |
| 6,015,993 A | 1/2000 | Voldman et al. |
| 6,046,487 A | 4/2000 | Benedict et al. |
| 6,059,895 A | 5/2000 | Chu et al. |
| 6,100,153 A | 8/2000 | Nowak et al. |
| 6,111,267 A | 8/2000 | Fischer et al. |
| 6,222,234 B1 | 4/2001 | Imai |
| 6,232,163 B1 | 5/2001 | Voldman et al. |
| 6,256,239 B1 | 7/2001 | Akita et al. |
| 6,258,664 B1 | 7/2001 | Reinberg |
| 6,281,059 B1 | 8/2001 | Cheng et al. |
| 6,291,321 B1 | 9/2001 | Fitzgerald |
| 6,294,834 B1 | 9/2001 | Yeh et al. |
| 6,339,232 B1 | 1/2002 | Takagi |
| 6,358,791 B1 | 3/2002 | Hsu et al. |
| 6,387,739 B1 | 5/2002 | Smith, III |
| 6,407,406 B1 | 6/2002 | Tezuka |
| 6,413,802 B1 | 7/2002 | Hu et al. |
| 6,414,355 B1 | 7/2002 | An et al. |
| 6,429,061 B1 | 8/2002 | Rim |
| 6,433,382 B1 | 8/2002 | Orlowski et al. |
| 6,448,114 B1 | 9/2002 | An et al. |
| 6,448,613 B1 | 9/2002 | Yu |
| 6,475,838 B1 | 11/2002 | Bryant et al. |
| 6,475,869 B1 | 11/2002 | Yu |
| 6,489,664 B1 | 12/2002 | Re et al. |
| 6,498,359 B1 | 12/2002 | Schmidt et al. |
| 6,518,610 B1 | 2/2003 | Yang et al. |
| 6,521,952 B1 | 2/2003 | Ker et al. |
| 6,524,905 B1 | 2/2003 | Yamamichi et al. |
| 6,525,403 B1 | 2/2003 | Inaba et al. |
| 6,555,839 B1 | 4/2003 | Fitzgerald |
| 6,558,998 B1 | 5/2003 | Belleville et al. |
| 6,573,172 B1 | 6/2003 | En et al. |
| 6,576,526 B1 | 6/2003 | Kai et al. |
| 6,586,311 B1 | 7/2003 | Wu |
| 6,600,170 B1 | 7/2003 | Xiang |
| 6,621,131 B1 | 9/2003 | Murthy et al. |
| 6,633,070 B1 | 10/2003 | Miura et al. |
| 6,653,700 B1 | 11/2003 | Chau et al. |
| 6,657,276 B1 | 12/2003 | Karlsson et al. |
| 6,686,247 B1 | 2/2004 | Bohr |
| 6,720,619 B1 | 4/2004 | Chen et al. |
| 6,724,019 B1 | 4/2004 | Oda et al. |
| 6,759,717 B1 | 7/2004 | Sagarwala et al. |
| 6,762,448 B1 | 7/2004 | Lin et al. |
| 6,784,101 B1 | 8/2004 | Yu et al. |
| 6,794,764 B1 | 9/2004 | Kamal et al. |
| 6,797,556 B1 | 9/2004 | Murthy et al. |
| 6,803,641 B1 | 10/2004 | Papa Rao et al. |
| 6,812,103 B1 | 11/2004 | Wang et al. |
| 6,872,610 B1 | 3/2005 | Mansoori et al. |
| 6,885,084 B1 | 4/2005 | Murthy et al. |
| 6,891,192 B1 | 5/2005 | Chen et al. |
| 2002/0031890 A1 | 3/2002 | Watanabe et al. |
| 2002/0074598 A1 | 6/2002 | Doyle et al. |
| 2002/0076899 A1 | 6/2002 | Skotnicki et al. |
| 2002/0125471 A1 | 9/2002 | Fitzgerald et al. |
| 2002/0153549 A1 | 10/2002 | Lalbowitz et al. |
| 2002/0190284 A1 | 12/2002 | Murthy et al. |
| 2003/0001219 A1 | 1/2003 | Chau et al. |
| 2003/0030091 A1 | 2/2003 | Bulsara et al. |
| 2003/0080386 A1 | 5/2003 | Ker et al. |
| 2004/0026765 A1 | 2/2004 | Currie et al. |
| 2004/0173815 A1 | 9/2004 | Yeo et al. |
| 2004/0217448 A1 | 11/2004 | Kumagai et al. |
| 2005/0029601 A1 | 2/2005 | Chen et al. |
| 2005/0121727 A1* | 6/2005 | Ishitsuka et al. ............ 257/369 |

FOREIGN PATENT DOCUMENTS

| | | |
|---|---|---|
| EP | 0 828 296 A2 | 3/1998 |
| WO | WO 03/017336 A2 | 2/2003 |

OTHER PUBLICATIONS

Nayak, D.K., et al., "Enhancement-Mode Quantum-Well Ge$_x$Si$_{1-x}$ PMOS," IEEE Electron Device Letters, vol. 12, No. 4, (Apr. 1991), pp. 154-156.

Gámiz, F., et al., "Strained-Si/SiGe-on-Insulator Inversion Layers: The Role of Strained-Si Layer Thickness on Electron Mobility," Applied Physics Letters, vol. 80, No. 22, (Jun. 3, 2002), pp. 4160-4162.

Gámiz, F., et al. "Electron Transport in Strained Si Inversion Layers Grown on SiGe-on-Insulator Substrates," Journal of Applied Physics, vol. 92, No. 1, (Jul. 1, 2002), pp. 288-295.

Mizuno, T., et al., "Novel SOI p-Channel MOSFETs With Higher Strain in Si Channel Using Double SiGe Heterostructures," IEEE Transactions on Electron Devices, vol. 49, No. 1, (Jan. 2002), pp. 7-14.

Tezuka, T., et al., "High-Performance Strained Si-on-Insulator MOSFETs by Novel Fabrication Processes Utilizing Ge-Condensation Technique," Symposium On VLSI Technology Digest of Technical Papers, (2002). pp. 96-97.

Jurczak, M., et al., "Silicon-on-Nothing (SON)—an Innovative Process for Advanced CMOS," IEEE Transactions on Electron Devices, vol. 47, No. 11, (Nov. 2000), pp. 2179-2187.

Jurczak, M., et al., "SON (Silicon on Nothing)—A New Device Architecture for the ULSI Era," Symposium on VLSI Technology Digest of Technical Papers, (1999), pp. 29-30.

Maiti, C.K., et al., "Film Growth and Material Parameters," Application of Silicon-Germanium Heterostructure, Institute of Physics Publishing, Ch. 2 (2001) pp. 32-42.

Tiwari, S., et al., "Hole Mobility Improvement in Silicon-on-Insulator and Bulk Silicon Transistors Using Local Strain," International Electron Device Meeting, (1997), pp. 939-941.

Ootsuka, F., et al., " A Highly Dense, High-Performance 130nm Node CMOS Technology for Large Scale System-on-a-Chip Applications," International Electron Device Meeting, (2000), pp. 575-578.

Matthews, J.W., et al., "Defects in Epitaxial Multilayers—I. Misfit Dislocations," Journal of Crystal Growth, vol. 27, (1974), pp. 118-125.

Matthews, J.W., et al., "Defects in Epitaxial Multilayers—II. Dislocation Pile-Ups, Threading Dislocations, Slip Lines and Cracks," Journal of Crystal Growth, vol. 29, (1975), pp. 273-280.

Matthews, J.W., et al., "Defects in Epitaxial Multilayers—III. Preparation of Almost Perfect Multilayers," Journal of Crystal Growth, vol. 32, (1976), pp. 265-273.

Schüppen, A., et al., "Mesa and Planar SiGe-HBTs on MBE-Wafers," Journal of Materials Science: Materials in Electronics, vol. 6, (1995), pp. 298-305.

Matthews, J.W., "Defects Associated with the Accomodation of Misfit Between Crystals," J. Vac. Sci. Technol., vol. 12, No. 1 (Jan./Feb. 1975), pp. 126-133.

Huang, X., et al., "Sub-50 nm P-Channel FinFET," IEEE Transactions on Electron Devices, vol. 48, No. 5, May 2001, pp. 880-886.

Shahidi, G.G., "SOI Technology for the GHz Era," IBM J. Res. & Dev., vol. 46, No. 2/3, Mar./May 2002, pp. 121-131.

Wong, H.-S.P., "Beyond the Conventional Transistor," IBM J. Res. & Dev., vol. 46, No. 2/3, Mar./May 2002, pp. 133-167.

Yang, F.L., et al, "25 nm CMOS Omega FETs," IEDM 2002, pp. 255-258.

Yang, F.L., et al., "35nm CMOS FinFETs," 2002 Symposium on VLSI Technology Digest of Technical Papers, 2002, pp. 104-105.

Shimizu, A., et al., "Local Mechanical-Stress Control (LMC): A New Technique for CMOS-Performance Enhancement," International Electron Devices Meeting (2001) pp. 433-436.

Thompson, S., et al., "A 90 nm Logic Technology Featuring 50nm Strained Silicon Channel Transistors, 7 Layers of Cu Interconnects, Low k ILD, and 1 um2 SRAM Cell," International Electron.

Welser, J., et al., "NMOS and PMOS Transistors Fabricated in Strained Silicon/Relaxed Silicon-Germanium Structures," International Electron Devices Meeting (Dec. 1992) pp. 1000-1002.

Blaauw, D., "Gate Oxide and Subthreshold Leakage Characterization, Analysis and Optimization," date unknown.

Cavassilas, N., et al., "Capacitance-Voltage Characteristics of Metal-Oxide-Strained Semiconductor Si/SiGe Heterostructures," Nanotech 2002, vol. 1, pp. 600-603.

Chang, L., et al., "Direct-Tunneling Gate Leakage Current in Double-Gate and Ultrathin Body MOSFETs," 2002 IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, 4 pgs.

"Future Gate Stack, "International SeMatech, 2001 Annual Report, 2 pgs.

Leitz, C.W., et al., "Hole Mobility Enhancements In Strained $Si/Si_{1-Y}Ge_y$ P-Type Metal-Oxide-Semiconductor Field-Effect Transistors Grown On Relaxed $Si_{1-x}Ge_x$ (x<y) Virtual Substrates," Applied Physics Letters, vol. 79, No. 25, Dec. 17, 2001, pp. 4246-4248.

Leitz, C.W., et al., "Channel Engineering of SiGe-Based Heterostructures for High Mobility MOSFETs," Materials Research Society Symposium Proceedings, vol. 686, 2002, pp. 113-118.

Liu, K.C., et al., "A Novel Sidewall Strained-Si Channel nMOSFET," IEDM, 1999, pp. 63-66.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Yeoh, J.C., et al., "MOS Gated Si:SiGe Quantum Wells Formed by Anodic Oxidation," Semiconductor Science Technology, vol. 13, 1998, pp. 1442-1445.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration, Lattice Press, Sunset Beach, California, 1990, pp. 144-145.

* cited by examiner

STRAINED CHANNEL TRANSISTOR AND METHODS OF MANUFACTURE

This application is a divisional application of Ser. No. 10/423,513 filed on Apr. 25, 2003, now U.S. Pat. No. 6,882,025 entitled "Strained-Channel Transistor and Methods of Manufacture," which application is hereby incorporated herein by reference.

TECHNICAL FIELD

The present invention relates generally to semiconductor devices and more particularly to a strained channel transistor and methods of manufacturing the same.

BACKGROUND

Size reduction of metal-oxide-semiconductor field-effect transistors (MOSFET), including reduction of the gate length and gate oxide thickness, has enabled the continued improvement in speed performance, density, and cost per unit function of integrated circuits over the past few decades.

To enhance transistor performance further, strain may be introduced in the transistor channel for improving carrier mobilities. Therefore, strain-induced mobility enhancement is another way to improve transistor performance in addition to device scaling. There are several existing approaches of introducing strain in the transistor channel region.

In one conventional approach, as described in a paper by J. Welser et al., published at the December 1992 International Electron Devices Meeting held in San Francisco, Calif., pp. 1000–1002 and incorporated herein by reference, a relaxed silicon germanium (SiGe) buffer layer is provided beneath the channel region. FIG. 1a shows such an approach. Referring to FIG. 1a, a semiconductor device 100 includes a strained silicon layer 110 formed over and abutting a relaxed SiGe layer 112, which is formed over and abutting a graded SiGe buffer layer 114. The graded SiGe buffer layer 114 is formed over and abutting a silicon substrate 116.

The relaxed SiGe layer 112 has a larger lattice constant compared to relaxed Si, and the thin layer of epitaxial Si 110 grown on the relaxed SiGe 112 will have its lattice stretched in the lateral direction, i.e., it will be under biaxial tensile strain. This result is illustrated in FIGS. 1b and 1c. Therefore, a transistor 118 formed on the epitaxial strained silicon layer 110 will have a channel region 120 that is under biaxial tensile strain. In this approach, the relaxed SiGe buffer layer 112 can be thought of as a stressor that introduces strain in the channel region 120. The stressor, in this case, is placed below the transistor channel region 120.

Significant mobility enhancement has been reported for both electrons and holes in bulk transistors using a silicon channel under biaxial tensile strain. In the abovementioned approach, the epitaxial silicon layer is strained before the formation of the transistor. But there are concerns about the strain relaxation upon subsequent CMOS processing where high temperatures are used. In addition, this approach is very expensive since a SiGe buffer layer with thickness in the order of micrometers has to be grown. Numerous dislocations in the relaxed SiGe buffer layer exist and some of these dislocations propagate to the strained silicon layer, resulting in a substrate with high defect density. Thus, this approach has limitations that are related to cost and fundamental material properties.

In another approach, strain in the channel is introduced after the transistor is formed. In this approach, a high stress film 132 is formed over a completed transistor structure 130 formed in a silicon substrate 136, as shown in FIG. 2. The high stress film or stressor 132 exerts significant influence on the channel 134, modifying the silicon lattice spacing in the channel region, and thus introducing strain in the channel region. In this case, the stressor 132 is placed above the completed transistor structure. This scheme is described in detail in a paper by A. Shimizu et al., entitled "Local mechanical stress control (LMC): a new technique for CMOS performance enhancement," published in pp. 433–436 of the Digest of Technical Papers of the 2001 International Electron Device Meeting, which is incorporated herein by reference.

The strain contributed by the high stress film is believed to be uniaxial in nature with a direction parallel to the source-to-drain direction. However, uniaxial tensile strain degrades the hole mobility while uniaxial compressive strain degrades the electron mobility. Ion implantation of germanium can be used to selectively relax the strain so that the hole or electron mobility is not degraded, but this is difficult to implement due to the close proximity of the n and p-channel transistors.

On the other hand, strain is known to be also introduced in the channel region by the formation of the isolation structure, such as the shallow trench isolation structure. While there is much prior art related to the formation and improvement of the isolation structure, e.g., U.S. Pat. Nos. 6,046,487, 5,763,315, and 5,447,884, this prior art has not addressed the separate optimization of strain for the n-channel and p-channel transistors. That is, the same isolation structure is used for all transistors, whether n-channel or p-channel transistors.

For example, FIG. 3a shows a transistor 140 formed in an active region isolated by shallow trench isolation (STI) regions 142. The STI regions 142 exert compressive stress on the active region, and the channel region 144 of the transistor 140 is therefore under compressive stress. While compressive stress in the channel region 144 improves the mobility of holes, it degrades the mobility of electrons. Therefore, the STI of FIG. 3a improves the performance of p-channel transistors while degrading the performance of n-channel transistors.

In FIG. 3b, another prior art trench isolation structure is shown where a nitride liner 146 is formed over an oxide liner 148. The nitride liner 146 acts as an oxidation mask, preventing further oxidation of the trench sidewalls. The nitride liner 146 minimizes confined volume expansion when the isolation trench is filled with oxide 150 and, therefore, reduces any compressive stress in the surrounding active region.

SUMMARY OF THE INVENTION

Aspects of this invention address the drawbacks of the prior art by optimizing the isolation structure induced strain for n-channel and p-channel transistors separately. For example, n-channel and p-channel transistors are each provided with strained channel regions. In particular, embodiments of the invention teach a structure and method of engineering the strain in the channel of the transistor by engineering the isolation structure to improve the performance of both the n-channel and p-channel transistors.

In one embodiment, a semiconductor device includes a region of semiconductor material with first and second isolation trenches formed therein. The first isolation trench is lined with a first material having a low oxygen diffusion rate and is filled with an insulating material. The second isolation trench is not lined with the first material but is filled with an insulating material. A first transistor is formed adjacent the first isolation region and a second transistor formed adjacent the second isolation region.

Several embodiments are provided. For example, the first material can be a nitride layer. The second trench can be lined with a nitride layer that has been modified, e.g., implanted with ions or removed. In another example, the first material can be an oxynitride (an nitrided oxide). In the case, the second trenches can be lined with an oxide liner or no liner at all, as examples.

Several methods of fabricating devices of various embodiments are also provided. For example, a plurality of trenches are formed in a semiconductor region, e.g., substrate or layer over a substrate. Each trench is lined with a liner. The liner can then be modified in some but not all of the plurality of trenches. Each trench would then be filed with an insulating material.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiment of the present invention relates to the field of semiconductor devices, and more specifically, to the manufacture of strained n-channel and p-channel field effect transistors with enhanced performance using separately optimized isolation regions.

Figure 4A:
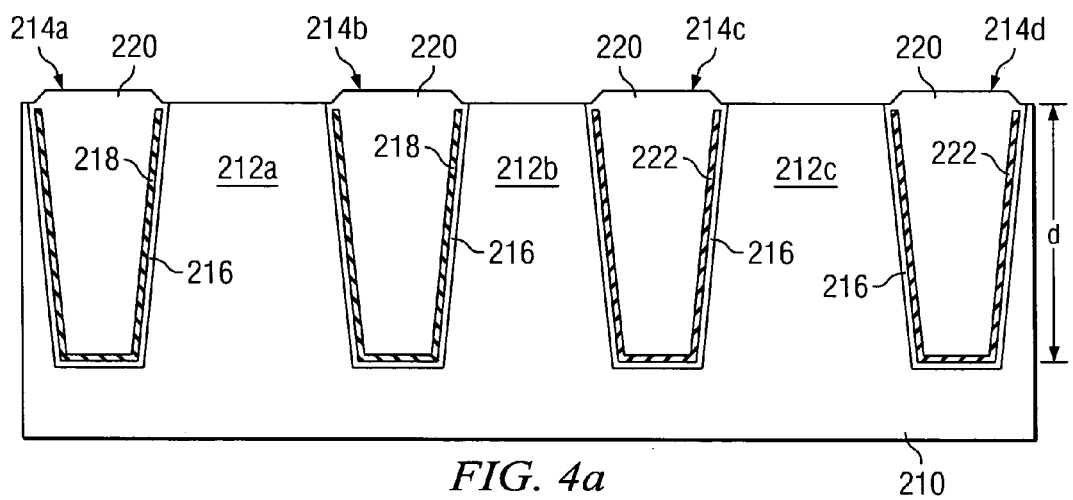
FIGS. 4a and 4b illustrate two embodiment structures of the present invention.
Figure 4B:
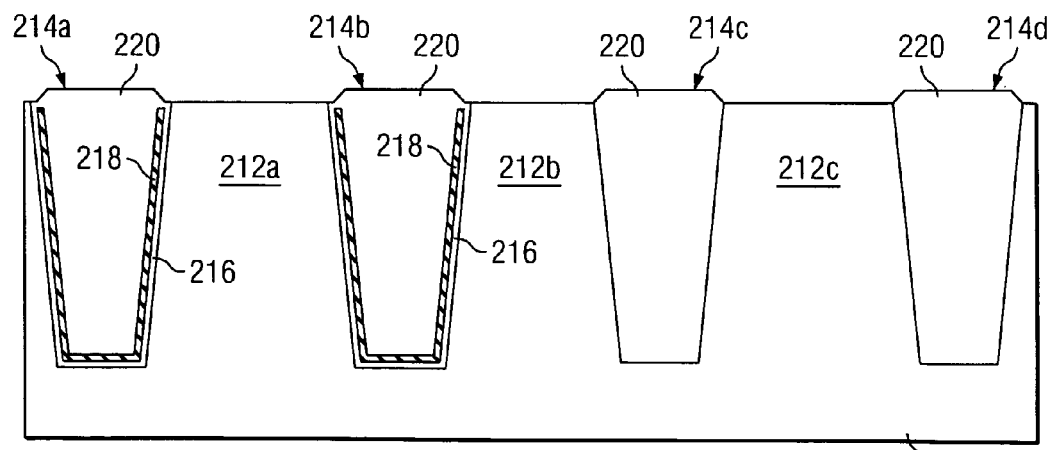

FIGS. 4a and 4b show the concept of separately optimizing the isolation structures for different active regions and the structural embodiments of the embodiments of the present invention. Referring now to FIG. 4a, a semiconductor substrate 210 is provided in which active regions 212a, 212b and 212c, collectively 212, are defined by isolation structures 214a, 214b, 214c and 214d, collectively 214. The isolation structures 214 are preferably trench isolation structures, and more preferably shallow trench isolation (STI) structures. It is noted that the isolation structures 214 are shown in cross-section and that certain ones of these structures can be portions of the same, e.g., annular, isolation structure.

At least two types of trench isolation structures may be provided. These types of isolation structures 214 differ in the nature of stress, e.g., compressive stress or tensile stress, in which they exert on the active regions 212. As shown in FIGS. 4a and 4b, a first active region 212a is surrounded by a first isolation structure 214a/b (including isolation structures 214a and 214b). Due to the nature and design of the first isolation structure 214a/b, the first active region 212a will be under tensile stress or under little or no stress.

An example of such a first isolation 214a/b structure is a shallow trench isolation (STI) with a silicon oxide liner 216 underlying a silicon nitride liner 218. The first isolation structure 212 also includes a trench filling material 220 such as chemical-vapor-deposited (CVD) silicon oxide (e.g., $SiO_2$). The trench filling material 220 may also be a combination of materials, such as CVD silicon oxide and CVD poly-silicon. The depth d of the isolation structure may be in the range of about 200 to about 6000 angstroms.

The silicon nitride liner 218 in the first isolation structure helps to reduce the in-plane compressive stress in the active region 212 due to a number of reasons. Firstly, the silicon nitride liner 218 restricts further oxidation of the trench sidewall after the formation of the silicon oxide liner 216, thus restricting volume expansion of the isolation structure 214. The silicon nitride liner 216 is able to restrict oxidation of the trench sidewall because of the low diffusion rate of oxygen through silicon nitride. It is understood that another material with low oxygen diffusion rate, e.g., silicon oxynitride ($SiO_xN_y$), may be used in place of the silicon nitride liner to achieve the same effect.

Volume expansion of an isolation structure that surrounds an active area compresses the sandwiched active region and, therefore, results in an in-plane compressive stress in that active region. By reducing the volume expansion, the in-plane compressive stress in the channel region can be reduced significantly. Secondly, a silicon nitride liner film usually has an associated intrinsic tensile stress. Since the silicon nitride liner film is itself under tensile stress, it exerts a vertical compressive stress on the trench sidewall surfaces.

This results in a vertical compressive strain and an in-plane tensile strain in the active region. Therefore, if the magnitude of the intrinsic tensile stress in the silicon nitride liner is large, the first isolation structure may result in the introduction of an in-plane tensile stress in the active region.

As shown in FIGS. 4a and 4b, a second isolation structure 214c/d is employed to define a second active region 212c, which will be provided with in-plane compressive strain. In a first embodiment, as shown in FIG. 4a, the second isolation structure 214c/d is a trench isolation structure with a silicon oxide liner 216 underlying an ion-implanted silicon nitride liner 222. The ion implantation introduces defects into the silicon nitride liner film 222 and causes it to lose or degrades its ability to block oxygen diffusion. Therefore, it is possible for oxygen to diffuse through silicon nitride 222 and result in further oxidation of the trench sidewall, causing volume expansion in a confined space, and therefore introducing in-plane compressive stress in the second active region.

The in-plane compressive stress results in an in-plane compressive strain in the crystal lattice of the material comprising the second active region 212c. It is desired that this in-plane compressive strain is not cancelled by an in-plane tensile strain component. By design, ion implantation of the silicon nitride liner 222 also additionally removes the intrinsic stress in the silicon nitride film 222. Examples of ion implant species that may be used to reduce the stress in the silicon nitride liner 222 are silicon ions and germanium ions. Other implantation ions such as silicon, geranium, nitrogen, helium, neon, argon, and xenon and combinations thereof could alternatively be used. In other words, silicon or germanium ions implanted into the silicon nitride liner 222 film will release or reduce the intrinsic stress in the film. By reducing the stress in the silicon nitride liner film 222, the silicon nitride liner 222 will not stress the sidewall surface of the second active region 212c and contribute an in-plane tensile strain component to cancel the desired in-plane compressive strain in the second active region 212c.

Figure 1A:
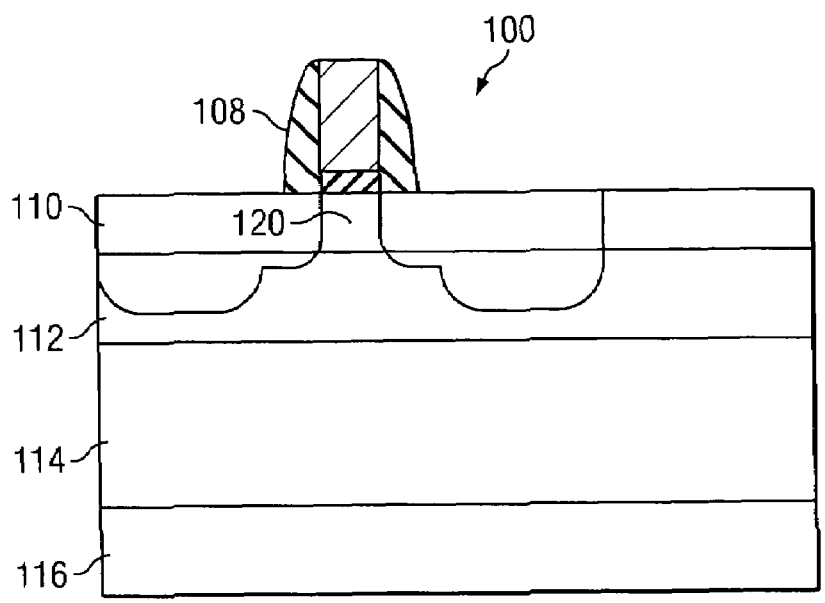
FIG. 1a shows a conventional strained silicon transistor with a relaxed SiGe layer as a stressor to induce strain in the top epitaxial strained silicon layer.
Figure 1B:
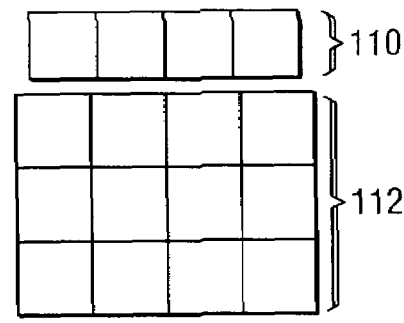
FIGS. 1b and 1c illustrate the origin of strain in the Si/SiGe heterostructure.
Figure 1C:
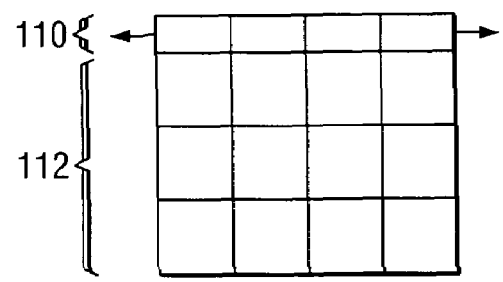
Figure 2:
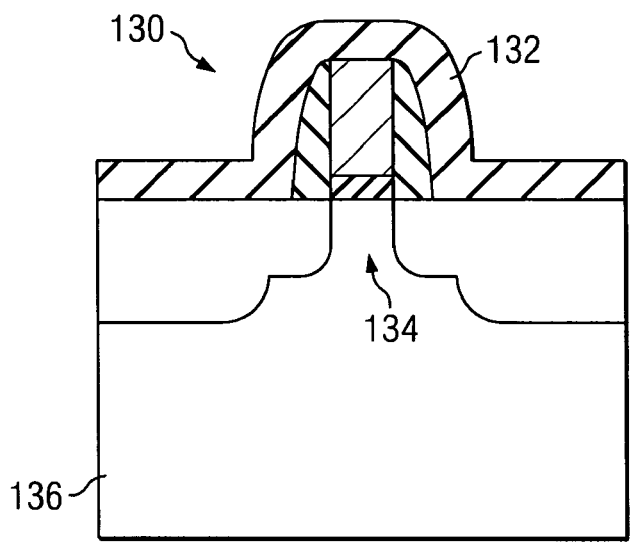
FIG. 2 illustrates another way of introducing strain in the channel is by using a high stress film as a stressor.
Figure 3A:
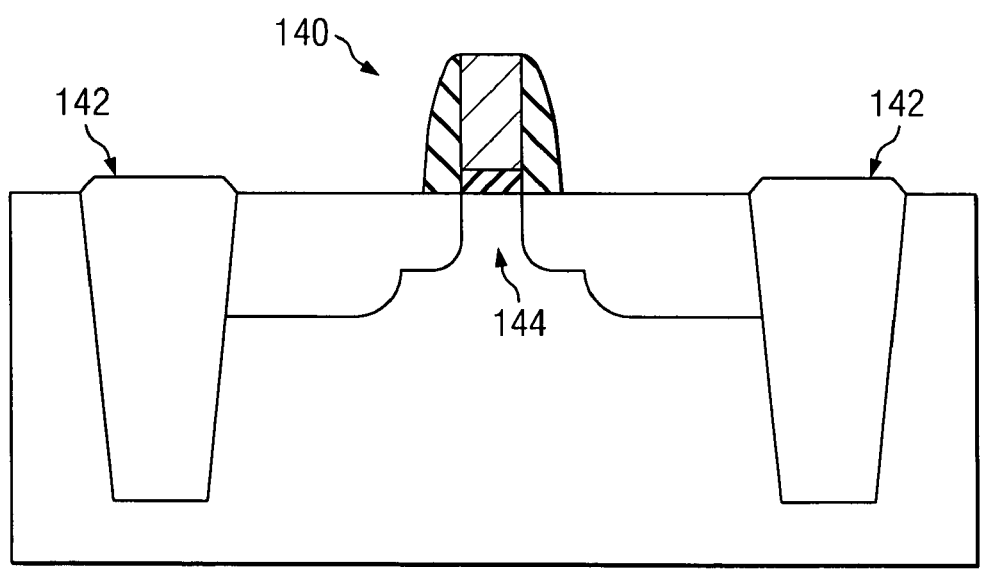
FIGS. 3a and 3b show conventional semiconductor devices with isolation structures.
Figure 3B:
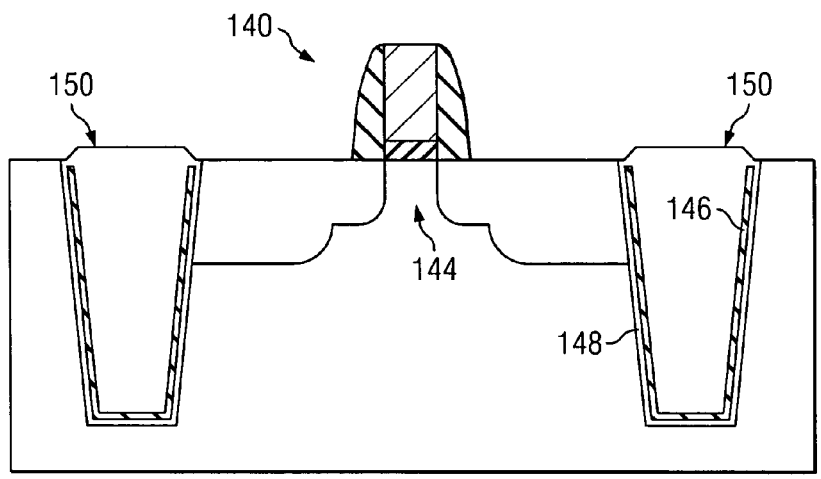

In a second embodiment, as shown in FIG. 4b, the second isolation structure 214c/d is a conventional trench isolation structure with a silicon oxide liner (not shown) and with no silicon nitride liner. The second isolation structure resembles the isolation structure of FIG. 3a and therefore results in an in-plane compressive strain in the second active region.

According to the preferred embodiment of the present invention, the first and second active regions 212a and 212c are provided on the same semiconductor substrate 210. By having the flexibility of providing active regions with different strain conditions, it is therefore possible to optimize the performance of n-channel and p-channel transistors by the choice and use of the appropriate strain conditions in the active regions. For example, n-channel transistors (not shown in FIG. 4) may be formed on the first active region 212a with tensile strain in their source-to-drain direction to improve their drive current performance. In another example, p-channel transistors (not shown in FIG. 4) may be formed on the second active region 212c with compressive strain in their source-to-drain direction to improve their drive current performance. While not ideal, it is also understood that p-channel transistors can be formed in first active region 212a and n-channel transistors in second active region 212c.

Figure 4C:
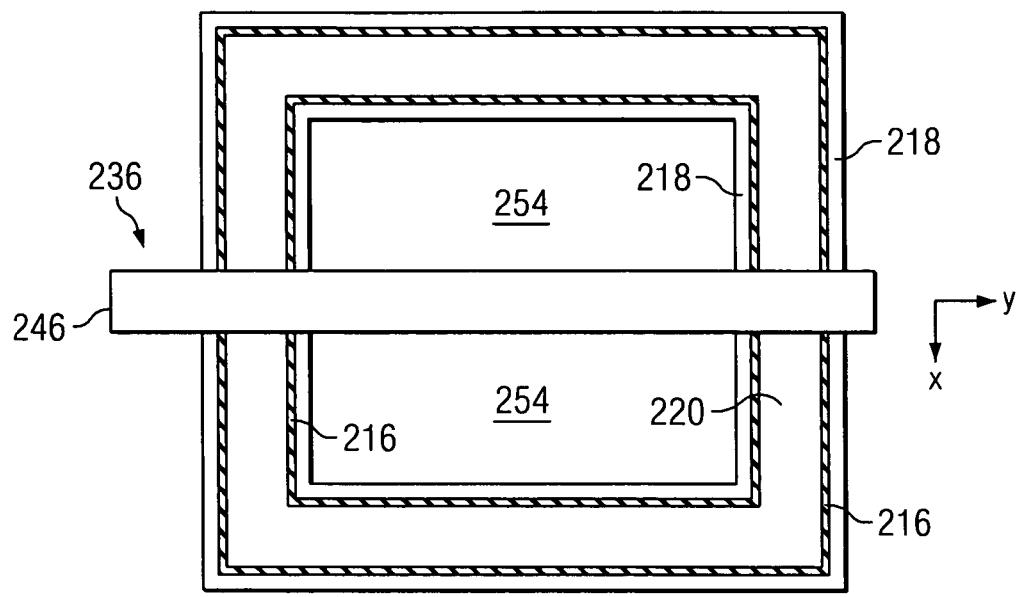
FIGS. 4c–4e show plan views of embodiments of the present invention.

FIG. 4c shows a top view of an n-channel transistor 236 formed in an active region surrounded by the first isolation structure 216/218/220. It is known that tensile strain in the source-to-drain direction (x-direction) or in a perpendicular direction (y-direction) improves the electron mobility. The channel region (below gate 246) of the n-channel transistor of FIG. 4c has tensile strain in both the x and y directions.

Figure 4D:
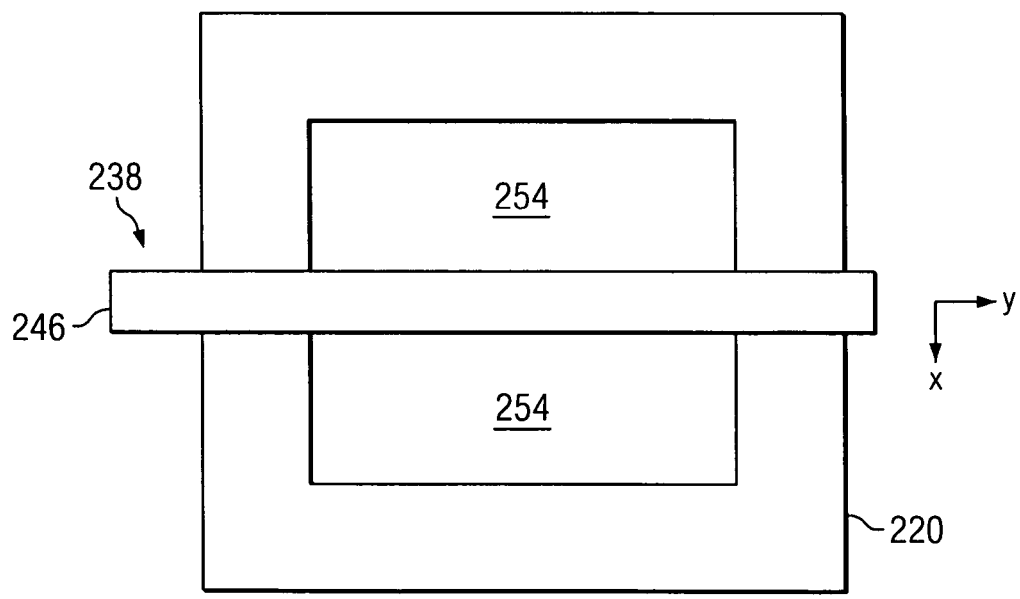

FIG. 4d shows a top view of a p-channel transistor 238 formed in an active region surrounded by the second isolation structure 220. In this case, compressive strain exists in the source-to-drain direction (x-direction) and in a perpendicular direction (y-direction). This configuration improves the hole mobility.

Figure 4E:
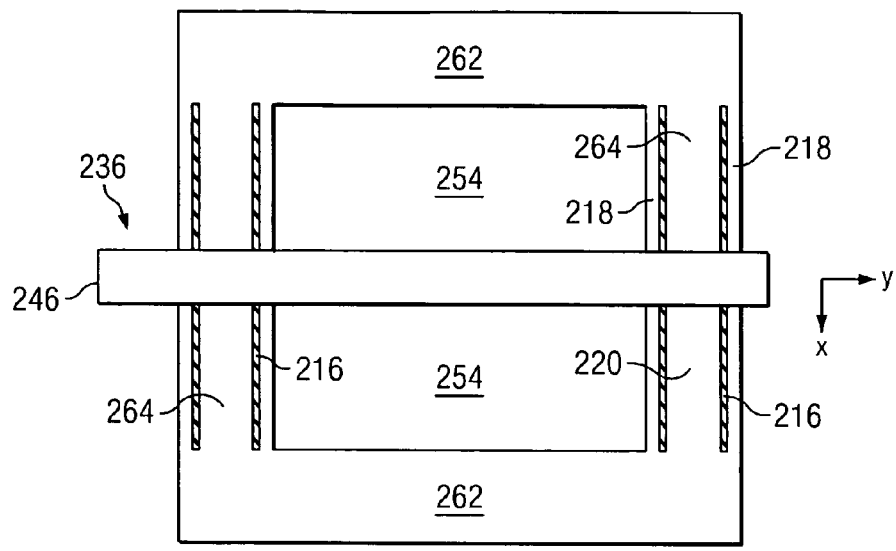

Another preferred embodiment is shown in FIG. 4e. In this case, a p-channel transistor 238 is formed in an active region sandwiched by the first isolation structure 262 in the y-direction and sandwiched by the second isolation 264 in the x-direction. Here, the first isolation structure 262 and the second isolation structure 264 are formed in different portions of a single annular trench. The p-channel transistor of FIG. 4e has a channel region that is under compressive strain in the x-direction and tensile strain in the y-direction. This configuration is beneficial for hole mobility. However, it is understood that the isolation structure surrounding the active region of a p-channel transistor may be completely formed be a second isolation structure, so that there is compressive strain in both the x and y directions.

The semiconductor substrate 210 may be comprised of an elemental semiconductor such as silicon or germanium, an alloy semiconductor such as silicon-germanium, or a compound semiconductor such as gallium arsenide or indium phosphide. The semiconductor substrate 210 may also be a layered substrate, for example, comprising of a silicon layer on a silicon-germanium layer on a silicon substrate. In another example, the semiconductor substrate may be a silicon-on-insulator substrate. The magnitude of tensile or compressive strain in the channel may range from about 0.1% to about 4%. In the preferred embodiment, the strain magnitude is about 1% to about 4%.

A transistor or transistors or other element (not shown) can be formed in active area 212b. Active region 212b is expected to experience compressive stress on one side and tensile stress on the other side. Therefore, active region 212b is expected to be under a stress that is intermediate between that experienced by active region 212a and 212c.

Several methods for the manufacture of the abovementioned structures will next be described.

The first embodiment method provides a process flow for forming active regions with different strain conditions. For the purpose of illustrating the first method embodiment, a silicon nitride liner overlying a silicon oxide liner is used. It is understood that another material with a low oxygen diffusion rate can be used in place of silicon nitride.

Figure 5A:
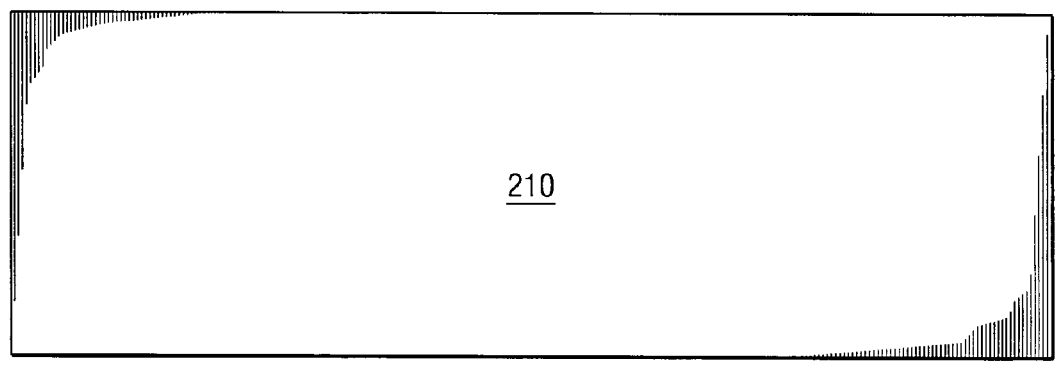
FIGS. 5a–5f illustrate an embodiment method of the present invention.

Referring now to FIG. 5a, a semiconductor substrate 210 is used as the starting material. This semiconductor substrate 210 may comprise an elemental semiconductor such as silicon or germanium, an alloy semiconductor such as silicon-germanium, or a compound semiconductor such as gallium arsenide or indium phosphide. The semiconductor substrate 210 may also be a layered substrate, for example, comprising of a silicon layer on a silicon-germanium layer on a silicon substrate. In another example, the semiconductor substrate may be a silicon-on-insulator substrate. In the preferred embodiment, the semiconductor substrate 210 is a monocrystalline silicon substrate.

Figure 5B:
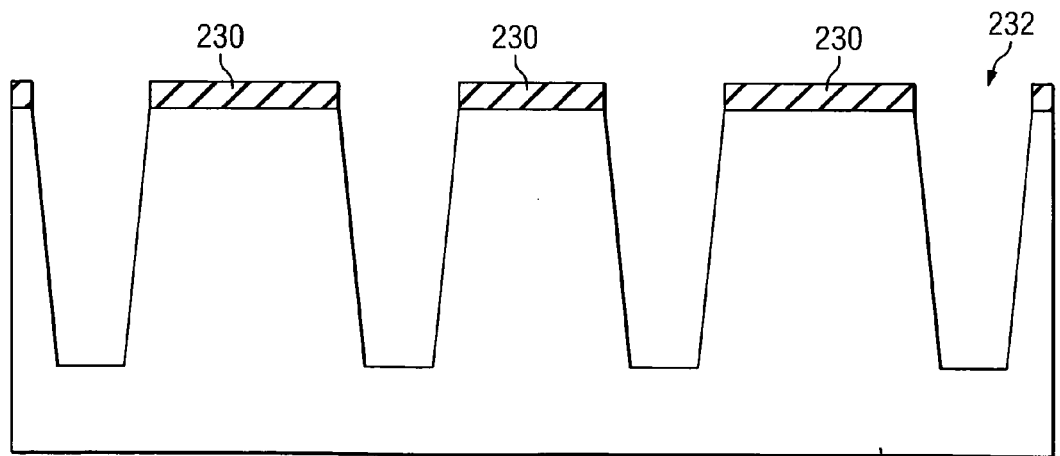

In FIG. 5b, a first patterned mask 230 is formed on the semiconductor substrate 210 and trenches 232 are etched. The first patterned mask 230 may comprise any masking material commonly used in the art, e.g. silicon oxide, silicon nitride, or a silicon nitride on silicon oxide stack. The first patterned mask 230 is preferably a silicon nitride on silicon oxide stack.

The trench 232 may be etched by anisotropic plasma etching. If the semiconductor substrate is a silicon substrate, the anisotropic plasma etching may employ a plasma with flourine chemistry, e.g., containing chemical species such as $CF_4$.

Figure 5C:
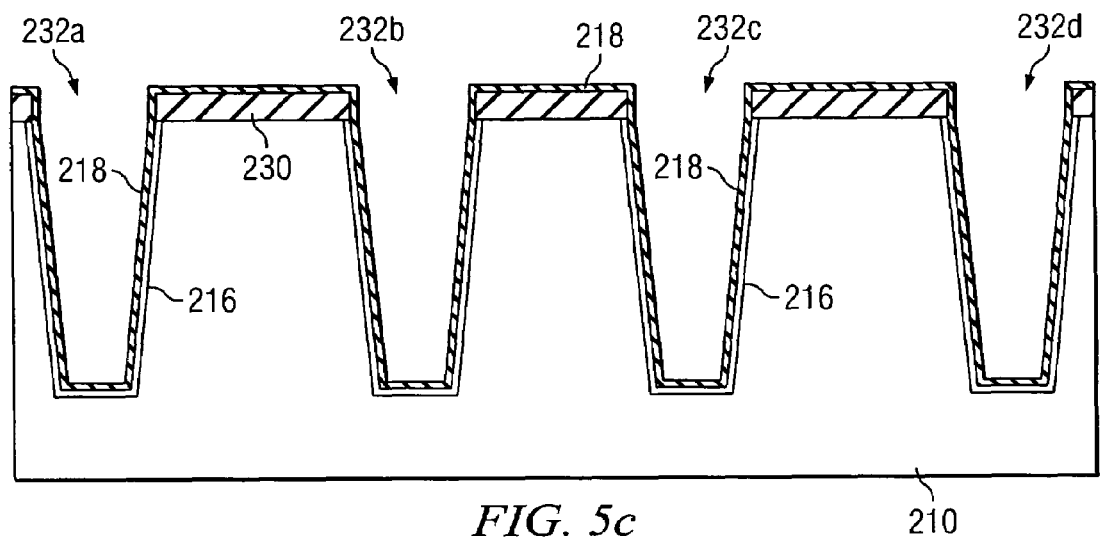

Next, as shown in FIG. 5c, an oxide liner 216 is formed in the trenches 232. The oxide liner 216 may be formed by a thermal oxidation step, e.g., using temperatures ranging from about 600 degrees Celsius to about 1000 degrees Celsius and an oxidizing ambient containing species such as oxygen and water. Alternatively, the oxide liner 216 could be deposited, e.g., by chemical vapor deposition.

A silicon nitride liner 218 is also conformally formed, e.g., by chemical vapor deposition. The chemical vapor deposition step may use precursor gases such as ammonia and silane. As discussed above, other materials can be alternatively, or additionally, used for the liner 218.

Figure 5D:
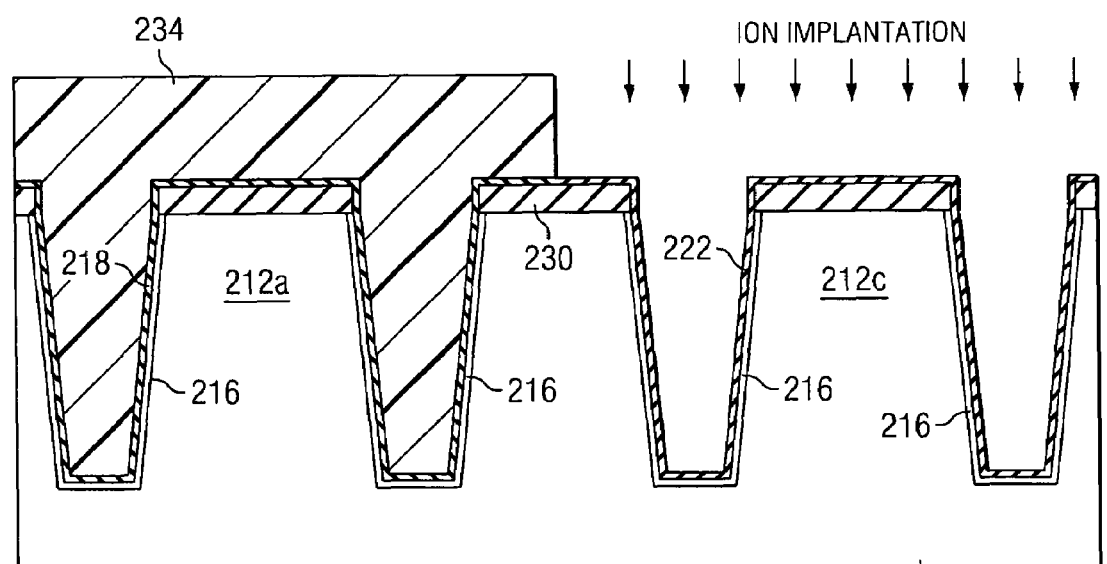
Figure 10:
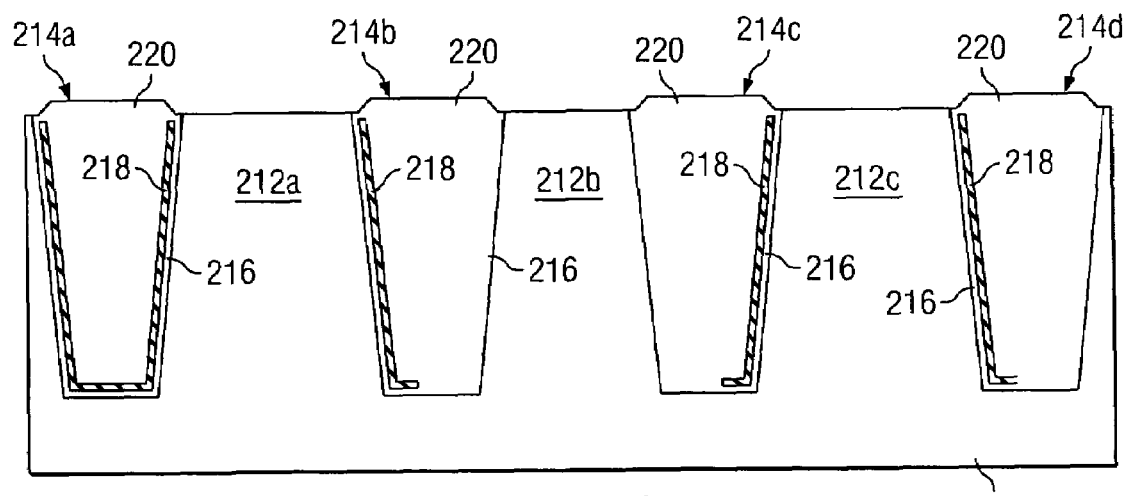
FIG. 10 shows a second alternate embodiment of the present invention.

Referring next to FIG. 5d, a second patterned mask 234 is used to cover selected regions, including the first active region 212a and at least a portion of adjacent trenches 232a and 232b. The second patterned mask 234 preferably comprises a photoresist such as any photoresist known in the art. FIG. 10 shows an embodiment where the mask 234 is patterned to cover a portion of a trench 232.

An ion implantation is then performed to alter the characteristics of the silicon nitride liner 218 in selected regions thus forming liner 222. The ion implanted silicon nitride liners 222 may, for example, be in the isolation structures surrounding the second active region 212c. The ion implantation process may be a conventional beam-line ion implantation process, a plasma immersion ion implantation (PIII), or any other ion implantation process known and used in the art. The dose of the ion implantation may be in the range of about 1E13 to about 1E16 ions per square centimeter and the energy may be in the range of about 10 eV to about 100 keV.

After the ion implantation process, the properties of the silicon nitride liner 222 will be altered such that its oxygen diffusion rate is faster and/or its intrinsic stress is reduced. In addition, portions of the silicon nitride 222 may be sputtered so that the implanted silicon nitride liner 222 may have a smaller thickness compared to the unimplanted silicon nitride liner 218 that is protected by the second patterned mask 234.

Figure 5E:
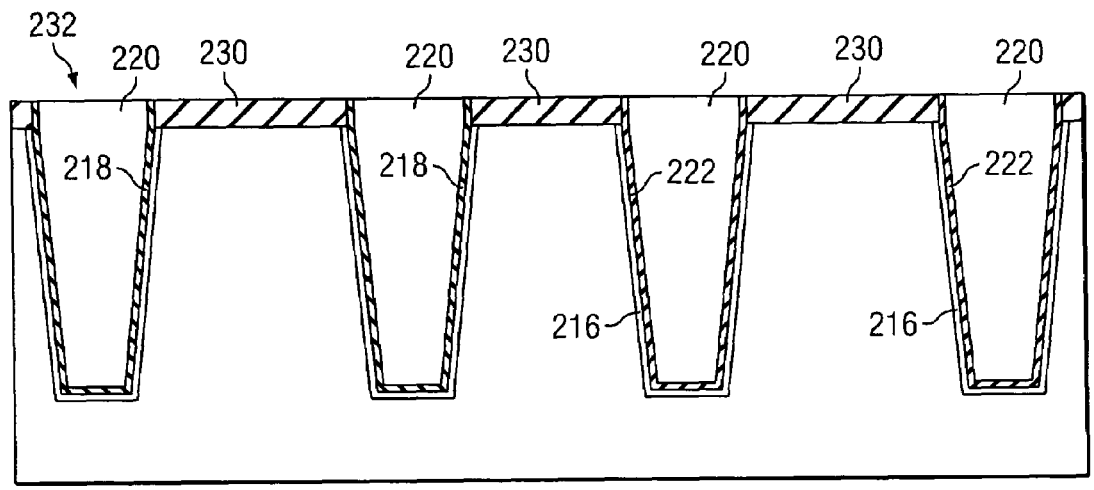

Referring now to FIG. 5e, the second patterned mask 234 may be removed after the ion implantation process step (or after the sputtering process if such process is used). A trench filling material 220, preferably silicon oxide, is filled into the trenches 232. It is understood that the trench filling material 220 may in fact be a combination of trench filling materials, such as a combination of CVD silicon oxide and CVD poly-silicon. A chemical mechanical polishing or etch-back step is then performed to planarize the surface of the wafer to give the cross-section as shown in FIG. 5e.

The first patterned mask 230 can then be removed. In the preferred embodiment, the first patterned mask 230 comprises a silicon nitride on a silicon oxide stack, and it may be removed by an etch in hot phosphoric acid followed by an etch in dilute hydrofluoric acid. This gives the cross-section shown in FIG. 5f.

Figure 5F:
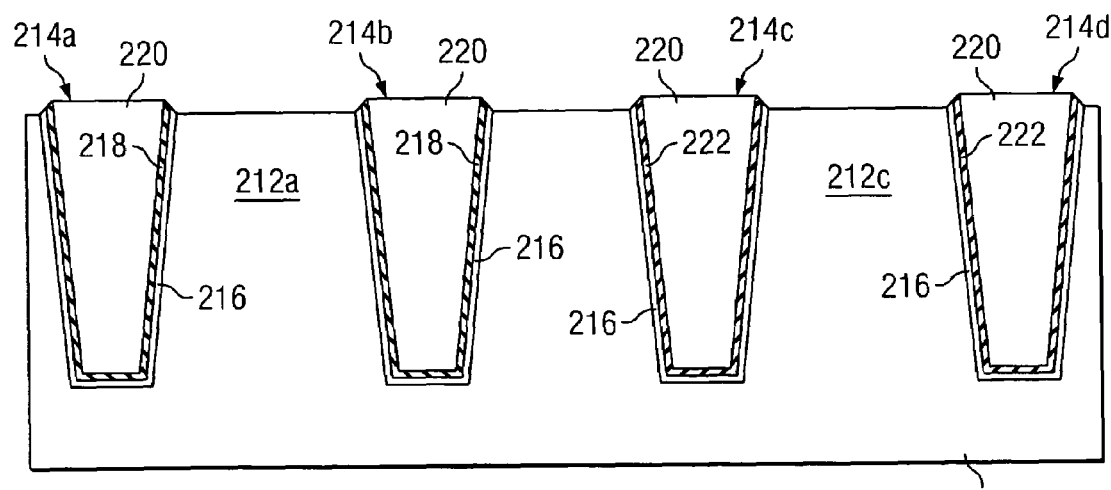
Figure 6A:
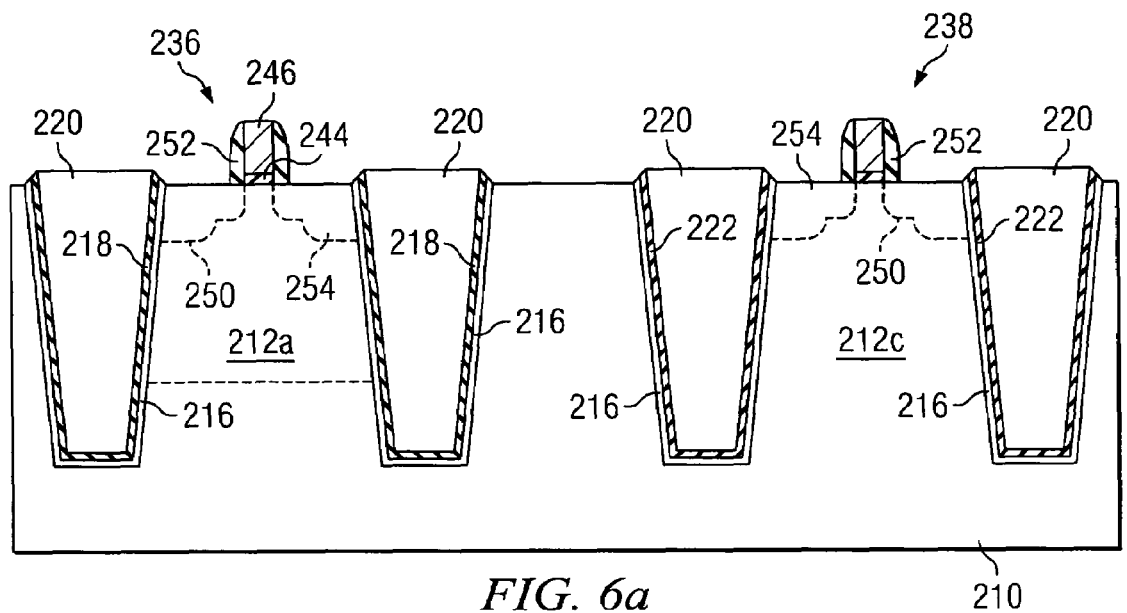
FIGS. 6a and 6b illustrate methods of forming transistors, which can apply to any of the methods of the present invention.
Figure 6B:
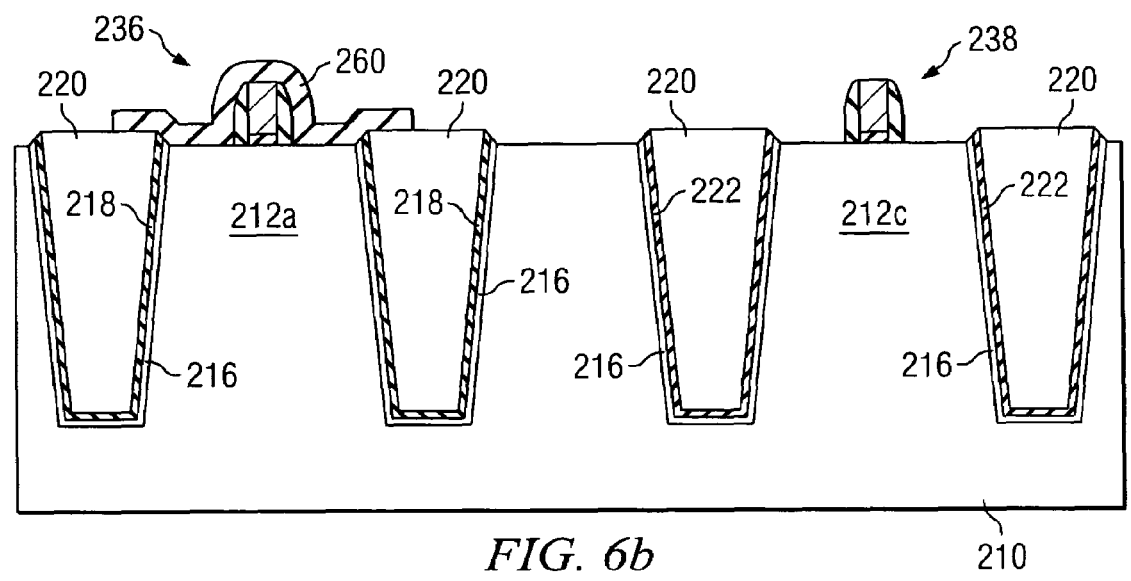

Transistors 236 and 238 can then be formed in the first and second active regions 212a and 212c of FIG. 5f, as shown in FIGS. 6a and 6b. For example, n-channel transistors 236 can be formed in the first active region 212a and p-channel transistors 238 can be formed in the second active region 212c, as shown in FIG. 6a. In forming the transistors, n-type doped and/or p-type doped wells (not shown) are formed in the active regions for p-channel and n-channel transistors, respectively. Depending on the conductivity of the substrate 210, one of the wells may be eliminated.

This is followed by gate dielectric 244 formation. The gate dielectric 244 may be formed by thermal oxidation, thermal oxidation followed by nitridation, chemical vapor deposition, sputtering, or other techniques known and used in the art for forming transistor gate dielectrics. The gate dielectric may comprise a conventional material such as silicon dioxide or silicon oxynitride with a thickness preferably ranging from about 3 angstroms to about 100 angstroms, preferably about 10 angstroms or less. The gate dielectric 244 may also comprise a high permittivity (high-k) material such as aluminum oxide ($Al_2O_3$), hafnium oxide ($HfO_2$), zirconium oxide ($ZrO_2$), hafnium oxynitride (HfON), hafnium silicate ($HfSiO_4$), zirconium silicate ($ZrSiO_4$), lanthanum oxide ($La_2O_3$) with an equivalent oxide thickness of about 3 angstroms to about 100 angstroms.

Next, the gate electrode 246 material is deposited. The gate electrode 246 material may be polycrystalline-silicon (poly-Si), poly-crystalline silicon-germanium (poly-SiGe), a refractory metal such as molybdenum and tungsten, compounds such as titanium nitride, or other conducting materials. Implants known as workfunction implants may be introduced in the gate electrode 246 material to alter the workfunction of the electrode. A gate mask (not shown) is deposited over the gate electrode material and patterned to define the gate electrode 246. The underlying gate electrode 246 material is then etched to form the gate electrode 246. The gate electrode 246 is electrically isolated from the channel region 248 by the gate dielectric 244. In the preferred embodiment, the gate electrode 246 material is poly-Si and the gate oxide 244 is silicon oxynitride. In the preferred embodiment, a plasma etch using chlorine and bromine chemistry may be used to etch the gate electrode 246 material with a high etch selectivity with respect to the gate dielectric 244.

After the definition of the gate electrode 246, the gate mask can be removed. The source and drain extension regions 250 are formed next. This may be achieved by ion implantation, plasma immersion ion implantation (PIII), or other techniques known and used in the art. Next, a spacer 252 is formed on the sidewalls of the gate electrode 246 by deposition and selective etching of the spacer material. The spacer material may comprise of a dielectric material such as silicon nitride or silicon dioxide.

The dopants in the source/drain regions 254 may be introduced by ion implantation, PIII, gas or solid source diffusion, or any other techniques known and used in the art. Any implant damage or amorphization can be annealed through subsequent exposure to elevated temperatures. The resistance of the source and drain can also be reduced by strapping the source/drain 254 with a conductive material (not shown). The conductive material can be formed using a self-aligned silicide, also known as salicide, process, or other metal deposition process. The conductive material may be formed on the source and drain regions (as well as the gate electrode 246). Passivation, contact etch, metallization are then performed to complete the device.

Furthermore, the separately optimized isolation structures of the present invention may be combined with other means of introducing strain in the transistor channel. As illustrated in FIG. 6b, a high stress film 260, i.e., a stressor, may be formed selectively over the n-channel transistor 236 in the first active region 212a to enhance the tensile strain in the channel region to improve electron mobility. The high stress film may be a high stress silicon nitride film deposited by plasma-enhanced chemical vapor deposition (PECVD) with an intrinsic stress of larger than about 500 mega-pascals (MPa), and more typically between about 500 MPa and about 1500 MPa. The high stress film or the stressor 260 further increases the tensile strain component in the lattice of the n-channel transistor 236 channel region 248 to further improve the electron mobility.

Figure 7A:
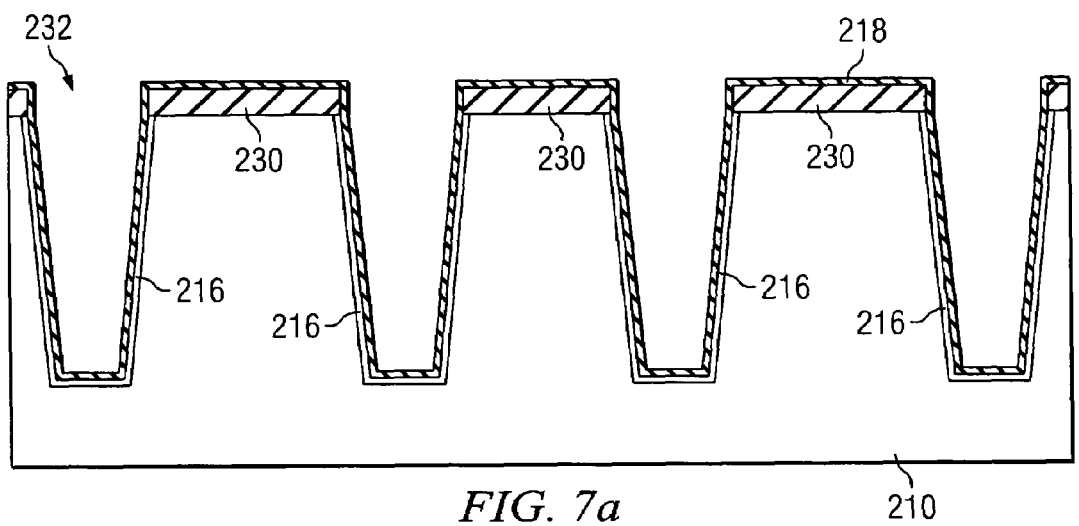
FIGS. 7a–7d illustrate an embodiment method of the present invention.

A second embodiment method provides another process flow for forming active regions with different strain conditions. The second method embodiment is identical to the first method embodiment in the first few process steps as illustrated in FIG. 5a to FIG. 5c. To describe the second method embodiment, we begin with the structure of FIG. 5c, as illustrated in FIG. 7a.

Figure 7B:
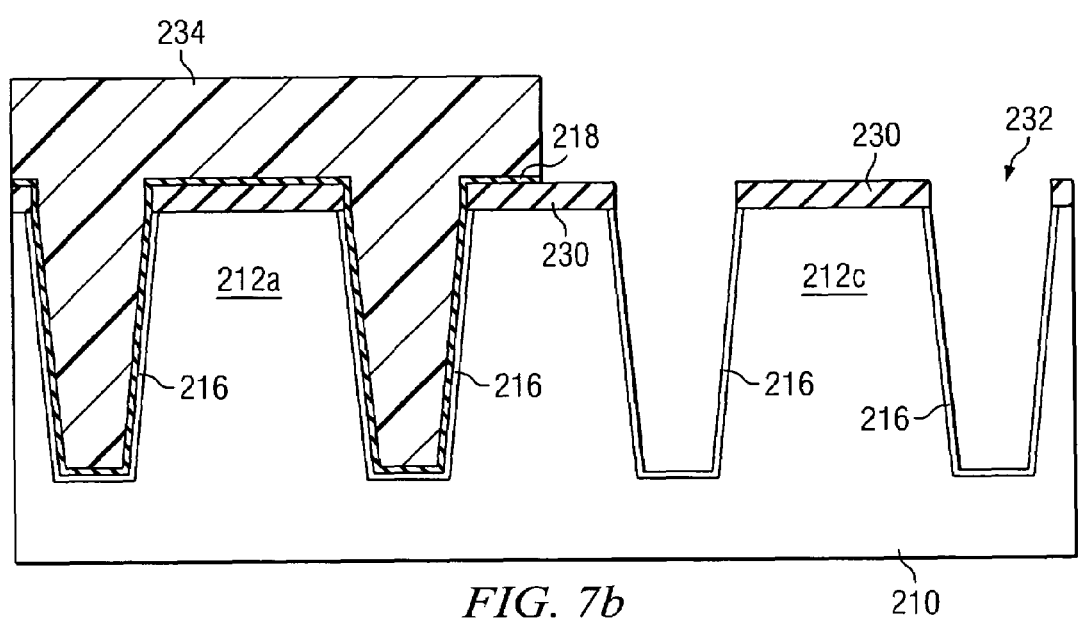

As shown in FIG. 7b, a second patterned mask 234 is used to cover selected regions, including the first active region 212a. The second patterned mask 234 preferably comprises a photoresist. The silicon nitride liner 218 is then removed in regions not covered by the second patterned mask 234. The removal of the silicon nitride liner may be accomplished by etching in a hot phosphoric acid, for example. The second patterned mask 234 may then be removed. Once again, FIG. 10 shows an embodiment where the mask 234 protects only a portion of a trench 232.

Figure 7C:
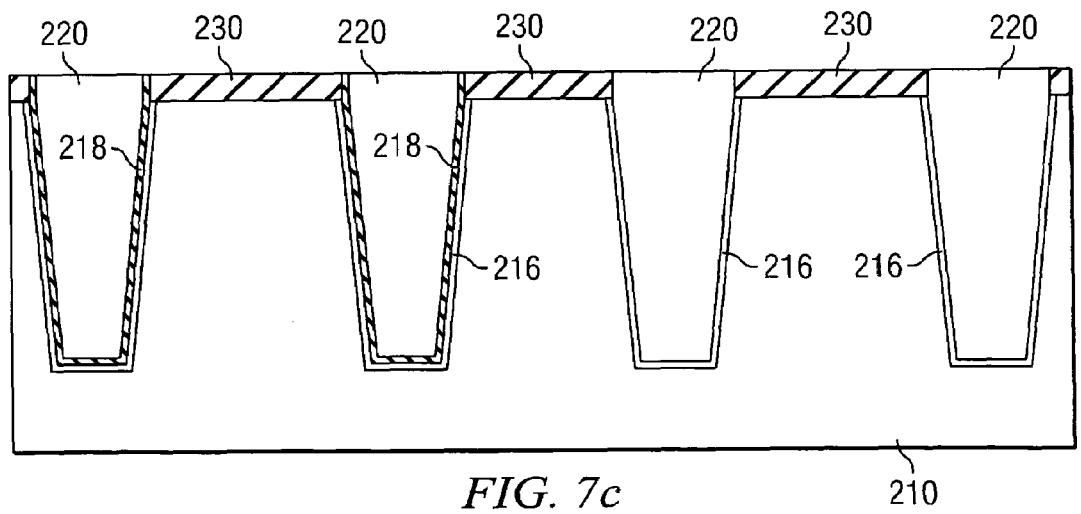
Figure 7D:
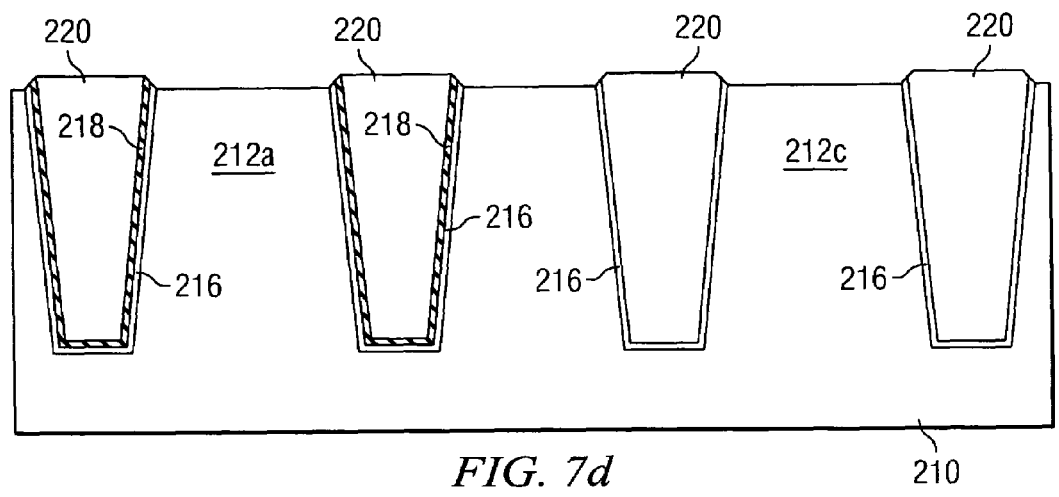

A trench filling material 220, preferably silicon oxide, is filled into the trenches. A chemical mechanical polishing or etch back step is then performed to planarize the surface of the wafer to give the cross-section as shown in FIG. 7c. The first patterned mask 230 can then be removed. In the preferred embodiment, the first patterned mask 230 comprises a silicon nitride on a silicon oxide stack, and it may be removed by an etch in hot phosphoric acid followed by an etch in dilute hydrofluoric acid. This gives the cross-section as shown in FIG. 7d.

Transistors (not shown in FIG. 7d; see e.g., FIG. 6b) may then be formed in the first and second active regions 212a and 212c. For example, n-channel transistors may be formed in the first active region 212a and p-channel transistors may be formed in the second active region 212c. The methods of forming the transistors have been described in the first method embodiment and will not be repeated here.

Figure 8A:
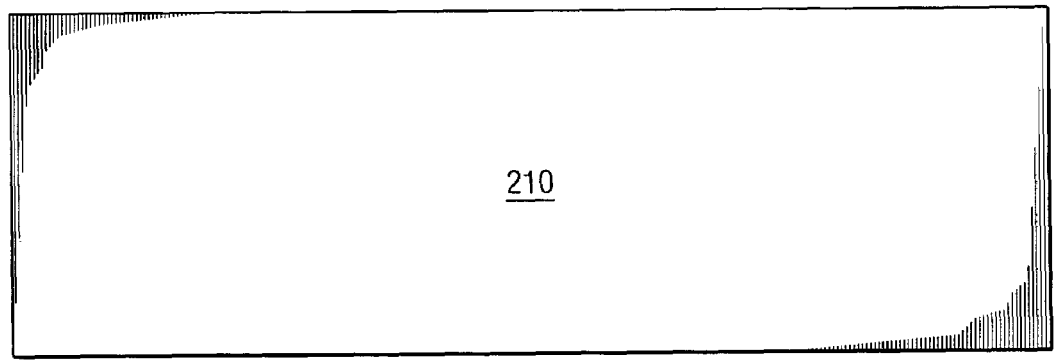
FIGS. 8a–8f illustrate an embodiment method of the present invention.
Figure 8B:
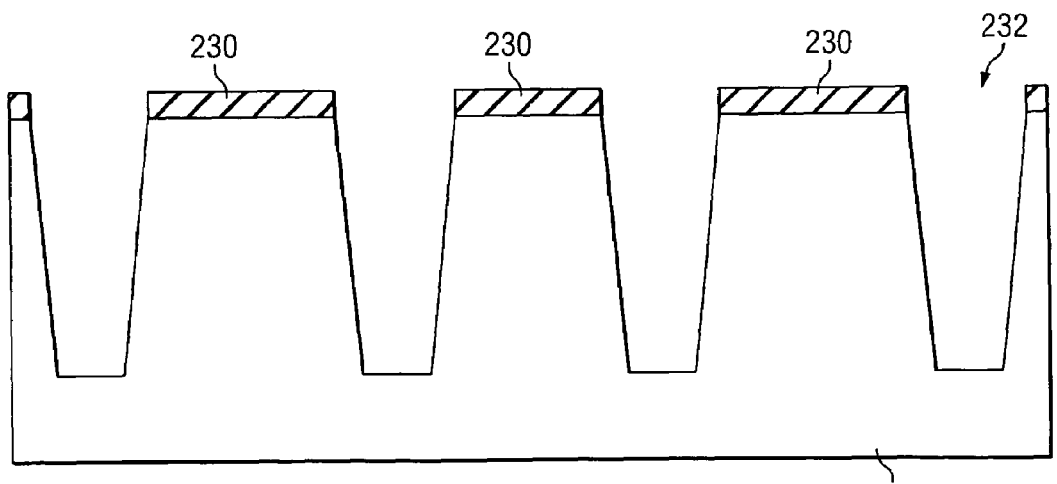
Figure 8C:
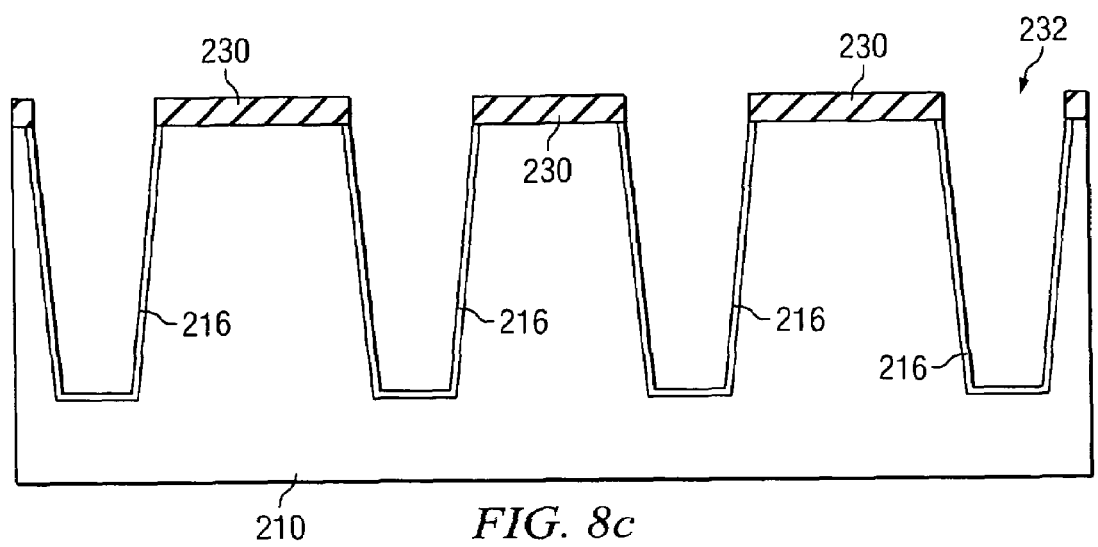

In the third embodiment method, another process flow is provided for forming active regions with different strain conditions. The starting material is a semiconductor substrate as shown in FIG. 8a. Trenches 232 are formed in the semiconductor substrate 210 using a first mask 230, as shown in FIG. 8b. A liner oxide 216, such as thermally grown silicon oxide, is then formed on at least the sidewalls of the trenches, as shown in FIG. 8c. It is understood that the liner oxide may also be formed by deposition techniques.

Figure 8D:
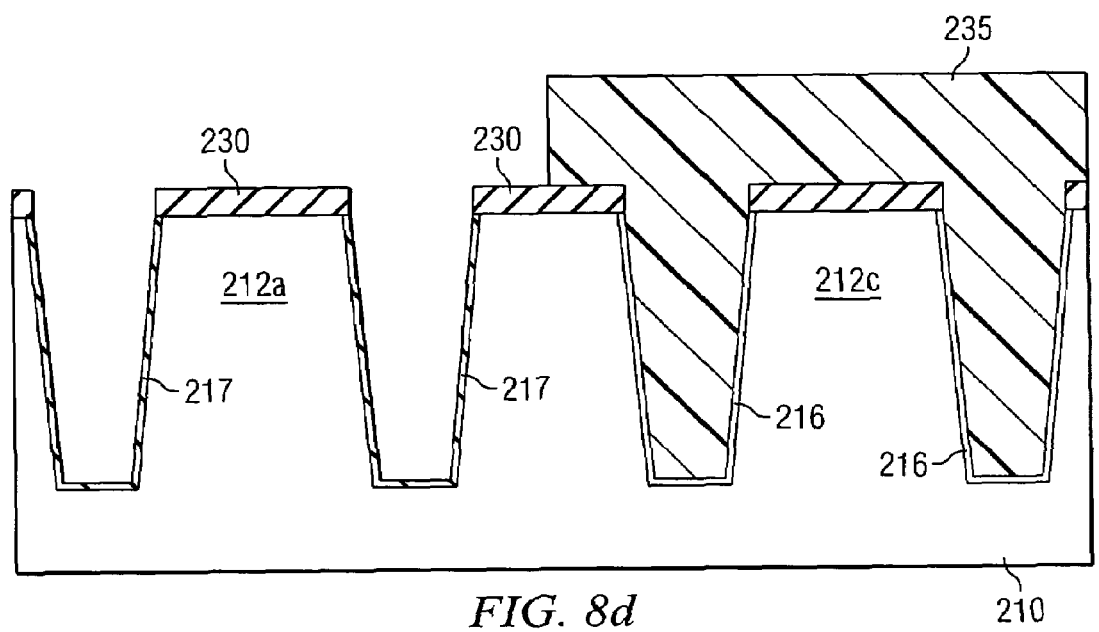

A second patterned mask 235 is formed to cover the second active region 212c, while exposing the first active region 212a, as shown in FIG. 8d. The mask 235 may cover all or a portion of the trenches 232. Liner oxide 216 not covered by the second patterned mask may be nitrided. The nitridation process forms a nitrided liner 217 and may include an ion implantation of nitrogen containing species, an anneal in a nitrogen-containing ambient, or exposure to nitrogen containing plasma. This step forms the barrier that will prevent diffusion of oxygen into active area 212a during filling of the trench.

Figure 8E:
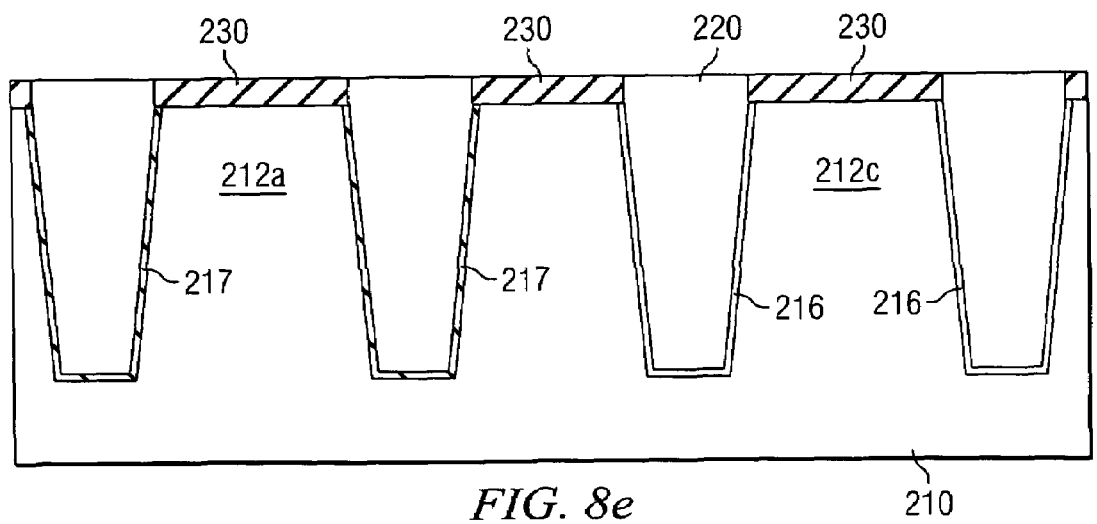
Figure 8F:
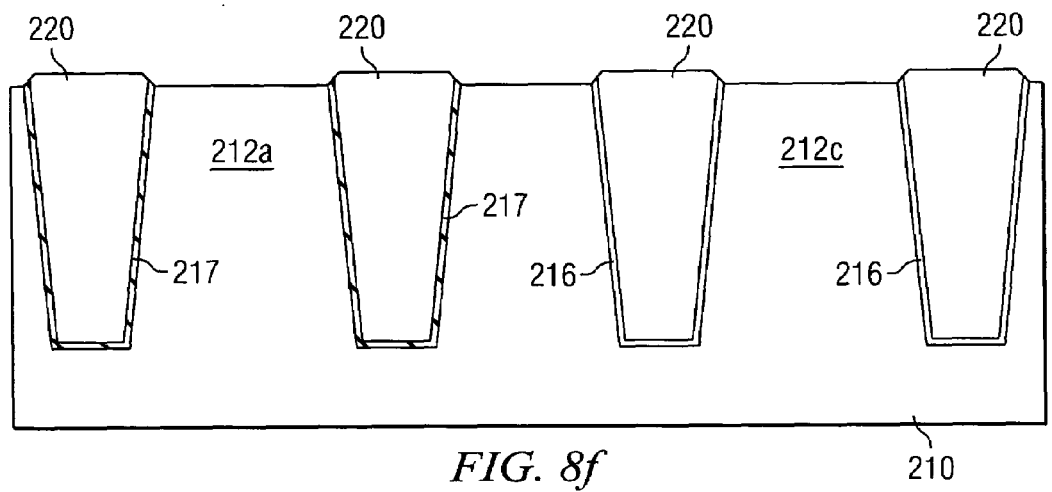

The second patterned mask 235 is then removed. A chemical mechanical polishing step is then performed to planarize the surface of the wafer to give the cross-section as shown in FIG. 8e. The first patterned mask 230 can then be removed. This gives the cross-section as shown in FIG. 8f. Transistors (see FIGS. 6a and 6b) may then be formed in the first and second active regions 212a and 212c of FIG. 8f. For example, n-channel transistors may be formed in the first active region and p-channel transistors may be formed in the second active region. The methods of forming the transistors have been described in the first method embodiment.

Figure 9A:
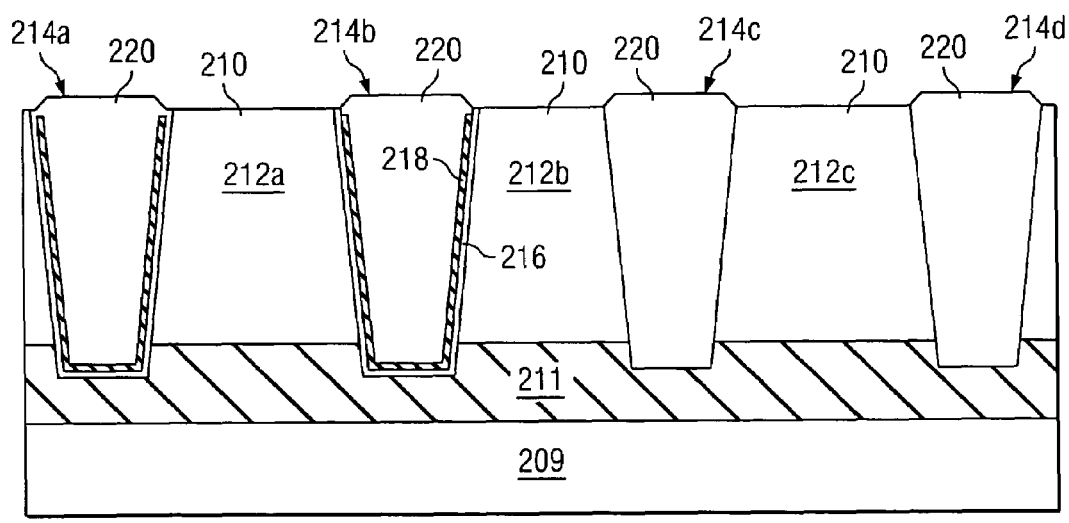
FIGS. 9a–9b show an alternate embodiment of present invention.
Figure 9B:
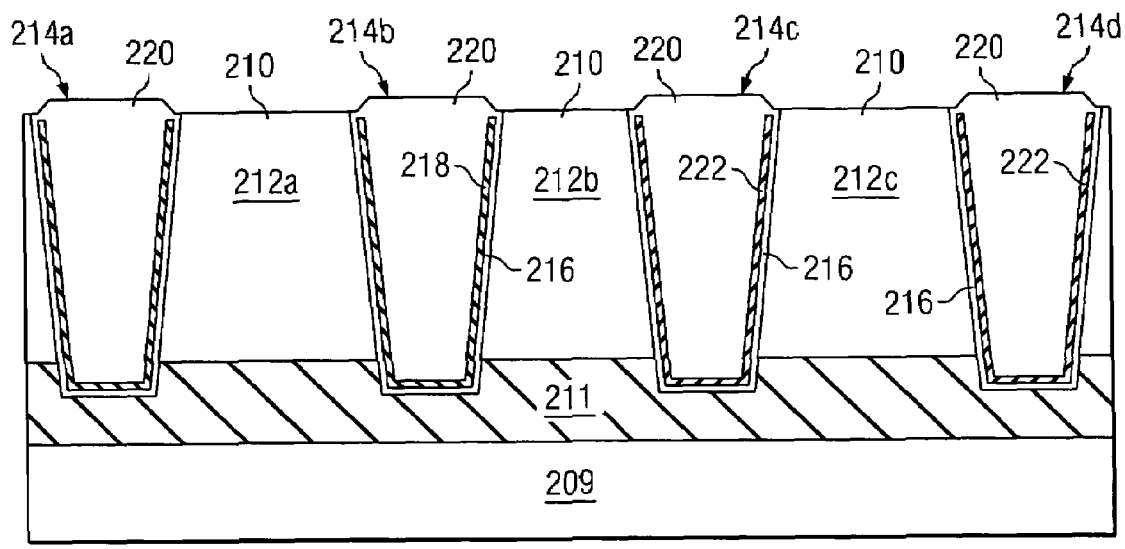

FIGS. 9a and 9b are provided to illustrate that the present invention can be utilized with an SOI substrate. In such a device, an insulating layer 211 is formed over substrate 209. The active regions 212 can then be formed in a semiconductor layer, e.g., epitaxially grown silicon, that overlies insulating layer 211. Any of the embodiments described above can be formed in a SOI device.

The SOI embodiments, as exemplified by FIGS. 9a and 9b, can include strained channel regions, where the strain is enhanced by other techniques. For example, a silicon-germanium layer (not shown) can be included between the insulating layer 211 and the active semiconductor layer 210. This additional layer can cause additional stress. Other techniques cold also be utilized.

FIG. 10 illustrates an alternate embodiment. In this embodiment, the techniques described herein are used in a portion of a given trench. For example, FIG. 10 shows an embodiment similar to that of FIG. 4b. In this case, a nitride liner 218 is formed in each of the trenches and then selectively removed. Referring to FIG. 10, the active region 212a is adjacent isolation regions 214a and 214b. Each portion of isolation region 214a/b that is adjacent active area 212a includes a nitride liner. On the other hand, each portion of isolation region 214b/c that is adjacent active region 212b includes no nitride liner. This is accomplished by having the nitride liner 218 formed along one but not both sidewalls of the trench of isolation region 214b. In this manner, active region 212a is under tensile stress and active region 212b is under compressive stress.

This concept can be utilized with any of the embodiments discussed herein. For example, if an angled implant is used, it is possible to perform an implant such that the nitride liner on one side of the trench is implanted while the nitride liner on the opposing side of the trench is not implanted.

Although particular embodiments of the invention have been described in detail, it is understood that the invention is not limited correspondingly in scope, but includes all changes, modifications, and equivalents coming within the spirit and terms of the claims appended hereto. Accordingly, the specification and figures are to be regarded in an illustrative rather than a restrictive sense.

The invention claimed is:

1. A method of forming a semiconductor structure, the method comprising:
   providing a semiconductor substrate;
   forming trenches in the semiconductor substrate;
   forming a silicon nitride liner layer overlying a silicon oxide liner layer in the trenches;
   implanting ions into the silicon nitride liner in selected trenches; and
   filling the trenches with a trench filling material.

2. The method of claim 1 wherein the ions are selected from the group consisting of silicon, germanium, nitrogen, helium, neon, argon, and xenon, and combinations thereof.

3. The method of claim 1 wherein a first active region is located adjacent a trench with a silicon nitride liner, and a second active region is located adjacent a trench with an implanted silicon nitride liner, the method further comprising:

forming an n-channel transistor in the first active region; and forming a p-channel transistor in the second active region.

4. The method of claim 3 and further comprising forming a high stress film over one of the n-channel transistor or the p-channel transistor.

5. The method of claim 4 wherein the high stress film is formed over the n-channel transistor and wherein the high stress film comprises a silicon nitride film with intrinsic tensile stress.

6. The method of claim 4 wherein the high stress film is formed by plasma-enhanced chemical vapor deposition.

7. The method of claim 1 wherein the semiconductor substrate comprises an elemental semiconductor, an alloy semiconductor, or a compound semiconductor.

8. The method of claim 7 wherein the semiconductor substrate is a silicon substrate.

9. The method of claim 1 wherein the semiconductor substrate comprises a silicon layer overlying a silicon germanium layer.

10. The method of claim 1 wherein the semiconductor substrate is a silicon-on-insulator substrate.

11. The method of claim 1 wherein the trenches are formed by anisotropic plasma etching and the depth of the trenches is in the range of about 200 to about 6000 angstroms.

12. The method of claim 1 wherein the silicon nitride liner layer is formed by chemical vapor deposition.

13. A method of forming a semiconductor structure, the method comprising:
providing a semiconductor substrate;
forming a plurality of trenches in the semiconductor substrate;
forming silicon nitride liner layer overlying a silicon oxide liner layer in the trenches;
removing the silicon nitride liner in some but not all of the plurality of the trenches; and
filling each trench in the plurality of trenches with a trench filling material.

14. The method of claim 13 wherein a first active region is formed between a pair of trenches with a silicon nitride liner, and a second active region is formed between a pair of trenches without a silicon nitride liner.

15. The method of claim 14 and further comprising forming an n-channel transistor in the first active region and forming a p-channel transistor in the second active region.

16. The method of claim 15 and further comprising forming a high stress film over the n-channel transistor or the p-channel transistor.

17. The method of claim 16 wherein the high stress film is formed over the n-channel transistor and wherein the high stress film comprises a silicon nitride film with intrinsic tensile stress.

18. The method of claim 16 wherein the high stress film is formed by plasma-enhanced chemical vapor deposition.

19. The method of claim 13 wherein the semiconductor substrate comprises a silicon substrate.

20. The method of claim 13 wherein the semiconductor substrate comprises a silicon layer overlying a silicon germanium layer.

21. The method of claim 13 wherein the semiconductor substrate comprises a silicon-on-insulator substrate.

22. The method of claim 13 wherein the trenches are formed by anisotropic plasma etching and the depth of the trenches is in the range of about 200 to about 6000 angstroms.

23. The method of claim 13 wherein the silicon nitride liner layer is formed by chemical vapor deposition.

24. A method of forming a semiconductor structure, the method comprising:
providing a semiconductor substrate;
forming trenches in the semiconductor substrate;
forming an oxide liner in the trenches;
nitriding the oxide liner in selected ones of the trenches but not nitriding the oxide liner in unselected ones of the trenches; and
filling the selected and the unselected ones of the trenches with a trench filling material.

25. The method of claim 24 wherein a first active region is located adjacent a trench with a nitrided oxide liner, and a second active region is located adjacent a trench with an oxide liner, the method further comprising:
forming an n-channel transistor in the first active region; and
forming a p-channel transistor in the second active region.

26. The method of claim 25 and further comprising forming a high stress film over one of the n-channel transistor or the p-channel transistor.

27. The method of claim 26 wherein the high stress film is formed over the n-channel transistor and wherein the high stress film comprises a silicon nitride film with intrinsic tensile stress.

28. The method of claim 26 wherein the high stress film is formed by plasma-enhanced chemical vapor deposition.

29. The method of claim 24 wherein the semiconductor substrate comprises a silicon substrate.

30. The method of claim 24 wherein the semiconductor substrate comprises a silicon layer overlying a silicon germanium layer.

31. The method of claim 24 wherein the semiconductor substrate comprises a silicon-on-insulator substrate.

32. The method of claim 24 wherein the trenches are formed by anisotropic plasma etching and the depth of the trenches is in the range of about 200 to about 6000 angstroms.

33. The method of claim 24 wherein the oxide liner is formed by thermal oxidation of a surface within the trench.

34. The method of claim 24 wherein nitriding the oxide liner comprises implanting a nitrogen containing species.

35. The method of claim 24 wherein nitriding the oxide liner comprises exposing the oxide liner to a nitrogen-containing plasma.

36. The method of claim 24 wherein nitriding the oxide liner comprises annealing the oxide liner in a nitrogen-containing ambient.

37. A method of forming a semiconductor device, the method comprising:
forming a plurality of trenches in a semiconductor region;
lining each trench in the plurality of trenches with a liner;
modifying the liner in some but not all of the plurality of trenches;
filling each trench in the plurality of trenches with an insulating material.

38. The method of claim 37 wherein filling each trench comprises filling each trench with an oxide.

39. The method of claim 37 wherein lining each trench comprises lining each trench in the plurality of trenches with a nitride liner.

40. The method of claim 39 wherein modifying the liner comprises implanting ions into the liner.

41. The method of claim 40 wherein the ions are selected from the group consisting of silicon, germanium, nitrogen, helium, neon, argon, and xenon, and combinations thereof.

42. The method of claim 37 wherein modifying the liner comprises removing the liner from some but not all of the plurality of trenches.

43. The method of claim 37 wherein lining each trench comprises lining each trench with an oxide liner.

44. The method of claim 43 wherein modifying the liner comprises nitriding some but not all of the oxide liners.

45. The method of claim 37 wherein a first active region is located adjacent a trench with a modified liner, and a second active region is located adjacent a trench with an unmodified liner, the method further comprising:

forming an n-channel transistor in the first active region; and forming a p-channel transistor in the second active region.

46. The method of claim 37 wherein a first active region is located adjacent a trench with a modified liner, and a second active region is located adjacent a trench with an unmodified liner, the method further comprising:

forming an p-channel transistor in the first active region; and forming a n-channel transistor in the second active region.

* * * * *